US008058173B2

(12) United States Patent
Shive et al.

(10) Patent No.: US 8,058,173 B2
(45) Date of Patent: Nov. 15, 2011

(54) METHODS FOR PRODUCING SMOOTH WAFERS

(75) Inventors: Larry W. Shive, St. Charles, MO (US); Brian L. Gilmore, Allen, TX (US)

(73) Assignee: MEMC Electronic Materials, Inc., St. Peters, MO (US)

( * ) Notice: Subject to any disclaimer, the term of this patent is extended or adjusted under 35 U.S.C. 154(b) by 881 days.

(21) Appl. No.: 11/960,236

(22) Filed: Dec. 19, 2007

(65) Prior Publication Data

US 2008/0160788 A1   Jul. 3, 2008

Related U.S. Application Data

(60) Provisional application No. 60/882,398, filed on Dec. 28, 2006.

(51) Int. Cl.
    *H01L 21/302* (2006.01)
(52) U.S. Cl. .. 438/692; 438/691; 438/795; 257/E21.214
(58) Field of Classification Search .................. 438/502, 438/509, 660–664, 692, 530, 540, 550, 522, 438/795–799
    See application file for complete search history.

(56) References Cited

U.S. PATENT DOCUMENTS

| | | | |
|---|---|---|---|
| 5,744,401 A | 4/1998 | Shirai et al. | |
| 6,294,469 B1 | 9/2001 | Kulkarni et al. | |
| 6,362,076 B1 | 3/2002 | Inazuki et al. | |
| 6,372,609 B1 | 4/2002 | Aga et al. | |
| 6,391,796 B1 | 5/2002 | Akiyama et al. | |
| 6,573,159 B1 | 6/2003 | Kobayashi et al. | |
| 6,899,762 B2 | 5/2005 | Wenski et al. | |
| 6,903,032 B2 | 6/2005 | Maleville et al. | |
| 6,962,858 B2 | 11/2005 | Neyret et al. | |
| 7,008,860 B2 | 3/2006 | Kakizaki et al. | |

FOREIGN PATENT DOCUMENTS

| | | |
|---|---|---|
| EP | 1041612 A | 10/2000 |
| FR | 2851372 A | 8/2004 |
| JP | 2001326228 | 11/2001 |

OTHER PUBLICATIONS

Yanase et al., "Atomic Force Microscopy Observation of Si(100) Surface after Hydrogen Annealing," J. Electrochem. Soc., Nov. 1994, vol. 141, No. 11, pp. 3259-3263.
Zhong et al. "Atomic Steps on a Silicon (001) Surface Tilted Toward an Arbitrary Direction," Appl. Phys. Lett, 1996, vol. 68, No. 13, pp. 1823-1825.
International Search Report for analogous Application No. PCT/US/2007/087633 dated Jun. 3, 2008.

*Primary Examiner* — N Drew Richards
*Assistant Examiner* — Mamadou Diallo
(74) *Attorney, Agent, or Firm* — Armstrong Teasdale LLP

(57) ABSTRACT

Methods for reducing the surface roughness of semiconductor wafers through a combination of rough polishing and thermally annealing the wafer.

53 Claims, 4 Drawing Sheets

METHODS FOR PRODUCING SMOOTH WAFERS

CROSS-REFERENCE TO RELATED APPLICATION

This application claims priority to U.S. Provisional Application No. 60/882,398, filed Dec. 28, 2006, the entire contents of which are incorporated herein by reference.

BACKGROUND OF THE INVENTION

This invention relates to the processing of silicon wafers and, more particularly, to processes for reducing the surface roughness of silicon wafers by a combination of polishing and thermal annealing of the wafers.

Nearly all microelectronic devices are built upon silicon substrates or semiconductor "chips". Device manufacturers produce the substrates by cutting the chips from silicon wafers. Silicon wafer suppliers most commonly prepare the wafers by slicing them from single crystal silicon ingots prepared by the Czochralski method. The Czochralski method involves drawing single crystal silicon from melted polycrystalline silicon by pulling a seed crystal brought into contact with the molten polycrystalline silicon.

In order to produce increasingly complex semiconductor devices, device manufacturers require smoother wafers. Many applications require "Grade 1" wafers. Grade 1 wafers typically possess a surface roughness of less than 1.5 Å as measured with a scan size of about 1 μm×about 1 μm and less than about 100 localized light scatterers above a size of about 65 nm per wafer.

Surface roughness is often measured by an atomic force microscope. An atomic force microscope operates by measuring the attraction or repulsion between a probe and the sample and correlating it to a distance. Surface roughness is often expressed as a statistical parameter, typically the arithmetic mean (Ra) or root mean square (RMS or Rq) average of the height deviations from the mean line. As used herein, surface roughness is expressed as the root mean square (RMS) unless indicated otherwise. The significance of the surface roughness measurement varies with the scan size of the atomic force microscope. Scan sizes of about 1 μm×about 1 μm or less generally correspond to shorter wavelength roughness while scan sizes of about 10 μm×about 10 μm or more generally correspond to longer wavelength roughness.

To achieve Grade 1 surface roughness specifications many silicon wafer manufacturers "rough" polish the wafer and then perform a "finish" polish (synonymously "mirror" polish) on the wafer. As can be seen from the lines referenced as "Rough" in FIG. 1 and in FIG. 2, a rough polish reduces the surface roughness of the wafer as measured with scan sizes of about 1 μm×about 1 μm to about 100 μm×about 100 μm to as low as about 1.5 Å and, more typically, to as low as about 1.9 Å. At shorter wavelengths a rough polish might reduce the surface roughness to less than about 2 Å as measured by scan sizes of about 0.1 μm×about 0.1 μm to about 1 μm×about 1 μm. Rough polishing uses a more potent chemistry as compared to finish polishing and results in removal of about 1 μm to about 20 μm and, more typically, from about 5 μm to about 15 μm of material from the surface of the wafer.

As can be seen from FIG. 1 and FIG. 2, a finish polish reduces the surface roughness of the wafer from the level obtained by rough polishing to about 1.7 Å to about 1.0 Å as measured by scan sizes of about 1 μm×about 1 μm to about 30 μm×about 30 μm. Finish polishes use a more dilute chemistry than rough polishes and remove only about 0.5 μm or less of material from the surface layer.

Finish polishing is generally costly and requires much processing time. A need exists for methods which reduce or eliminate finish polishing but which result in wafers with satisfactory short and long wavelength surface roughness.

SUMMARY OF THE INVENTION

One aspect of the present invention is directed to a method for reducing the surface roughness of a semiconductor wafer having a front surface and a back surface. The method comprises polishing the front surface of the wafer but the polishing step does not reduce the roughness of the front surface of the wafer to below about 1.5 Å as measured with scan sizes of about 1 μm×about 1 μm to about 100 μm×about 100 μm. The polished wafer is thermally annealed at a temperature of at least about 1050° C. for a period of at least about 5 minutes in an atmosphere comprising an inert gas, hydrogen or a mixture thereof.

A further aspect is directed a method for reducing the surface roughness of a semiconductor wafer having a front surface and a back surface. The method comprises polishing the front surface of the wafer but the polishing step does not reduce the roughness of the front surface of the wafer to below about 1.3 Å as measured with a scan size of about 10 μm×about 10 μm. The polished wafer is thermally annealed at a temperature of at least about 1050° C. for a period of at least about 5 minutes in an atmosphere comprising an inert gas, hydrogen or a mixture thereof.

Another aspect is directed to a method for reducing the surface roughness of a semiconductor wafer. The method comprises polishing the front surface of the wafer, but the polishing step does not reduce the roughness of the front surface of the wafer to below about 1.5 Å as measured with scan sizes of about 1 μm×about 1 μm to about 100 μm×about 100 μm. The polished wafer is thermally annealed to reduce the roughness of the front surface of the wafer to below about 1.5 Å as measured with scan sizes of about 1 μm×about 1 μm to about 30 μm×about 30 μm.

A further aspect of the present invention is directed to a method for reducing the surface roughness of a semiconductor wafer. The wafer contains a substantially void-free region at least about 10 μm in thickness at the front surface of the wafer. The method comprises polishing the front surface of the wafer but the polishing step does not reduce the roughness of the front surface of the wafer to below about 1.5 Å as measured with scan sizes of about 1 μm×about 1 μm to about 100 μm×about 100 μm. The polished wafer is thermally annealed at a temperature of at least about 1150° C. for a period of at least about 10 minutes in an atmosphere comprising an inert gas, hydrogen or a mixture thereof.

Various refinements exist of the features noted in relation to the above-mentioned aspects of the present invention. Further features may also be incorporated in the above-mentioned aspects of the present invention as well. These refinements and additional features may exist individually or in any combination. For instance, various features discussed below in relation to any of the illustrated embodiments of the present invention may be incorporated into any of the above-described aspects of the present invention, alone or in any combination.

DETAILED DESCRIPTION

According to some embodiments of the present invention, the surface of a semiconductor wafer is rough polished and thermally annealed to produce a Grade 1 quality wafer without finish polishing the wafer. According to some embodiments and with reference to FIG. 1 and FIG. 2, a surface of a semiconductor wafer is polished, but not below a roughness shown as "Rough." The wafer is then thermally annealed to reduce the surface roughness to, for example and without limitation, that shown in FIG. 1 as "Rough & Anneal" and that shown in FIG. 2 as "Rough & 1200 C/Ar" and/or "Rough & 1200 C/25% $H_2$".

As shown by the line labeled "Rough" in FIG. 1 and in FIG. 2, rough polishing does not reduce the roughness of the wafer to below about 1.5 Å and typically not below about 1.9 Å as measured with scan sizes of about 1 μm×about 1 μm to about 100 μm×about 100 μm. The surface roughness of the rough polished wafer is not reduced to below about 1.3 Å at a scan size of about 10 μm×about 10 μm.

Typically the rough polish results in a wafer with short wavelength surface roughness less than about 2 Å as measured by scan sizes of about 0.1 μm×about 0.1 μm to about 1 μm×about 1 μm. The rough polish typically removes a surface thickness of between about 1 μm and about 20 μm and more typically from about 5 μm to about 15 μm of material from the surface of the wafer.

Figure 1:
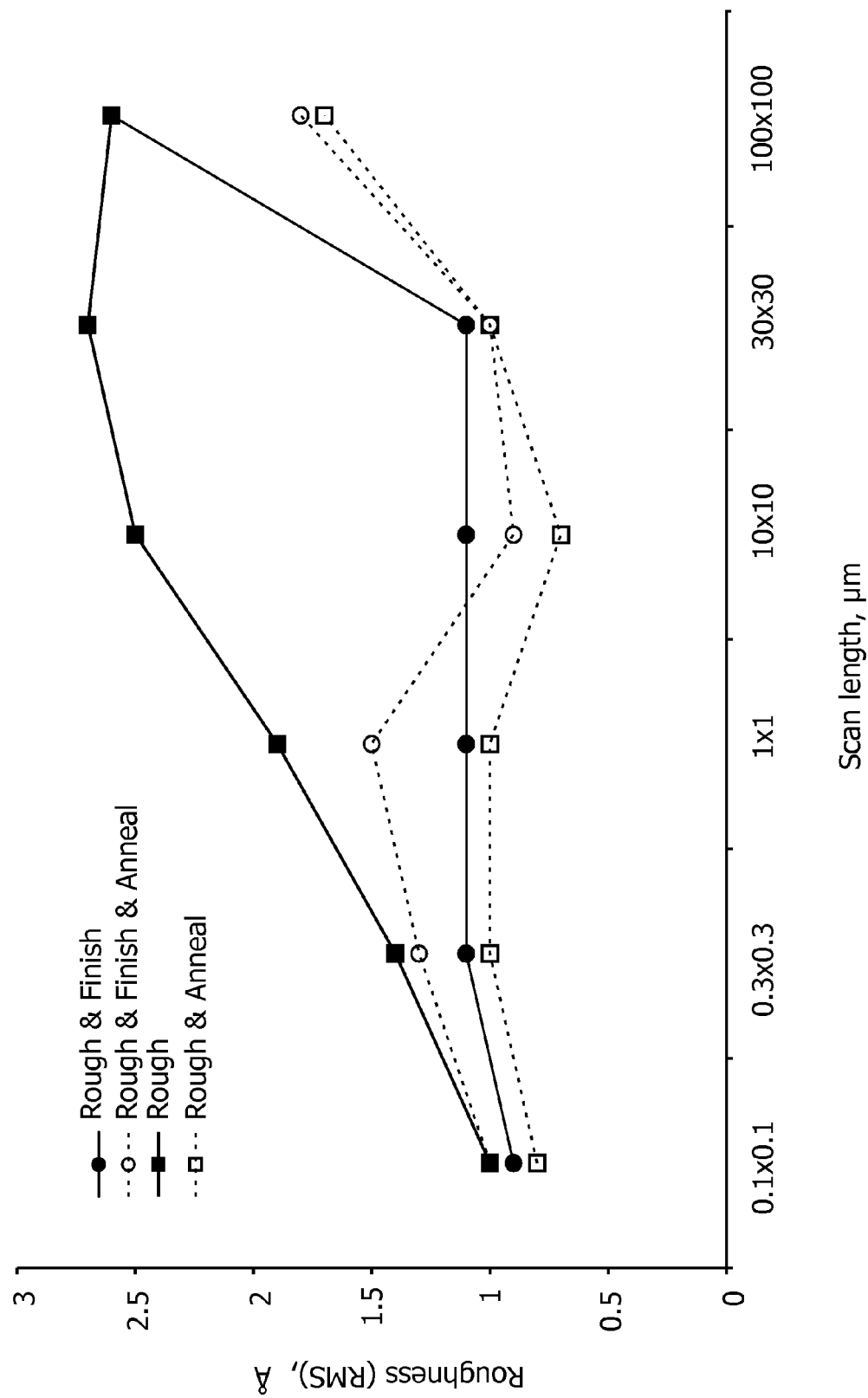
FIG. 1 is a graphical depiction of the average surface roughness (RMS) of several sets of wafers treated according to the process of Example 1 as measured with six different scan lengths.
Figure 2:
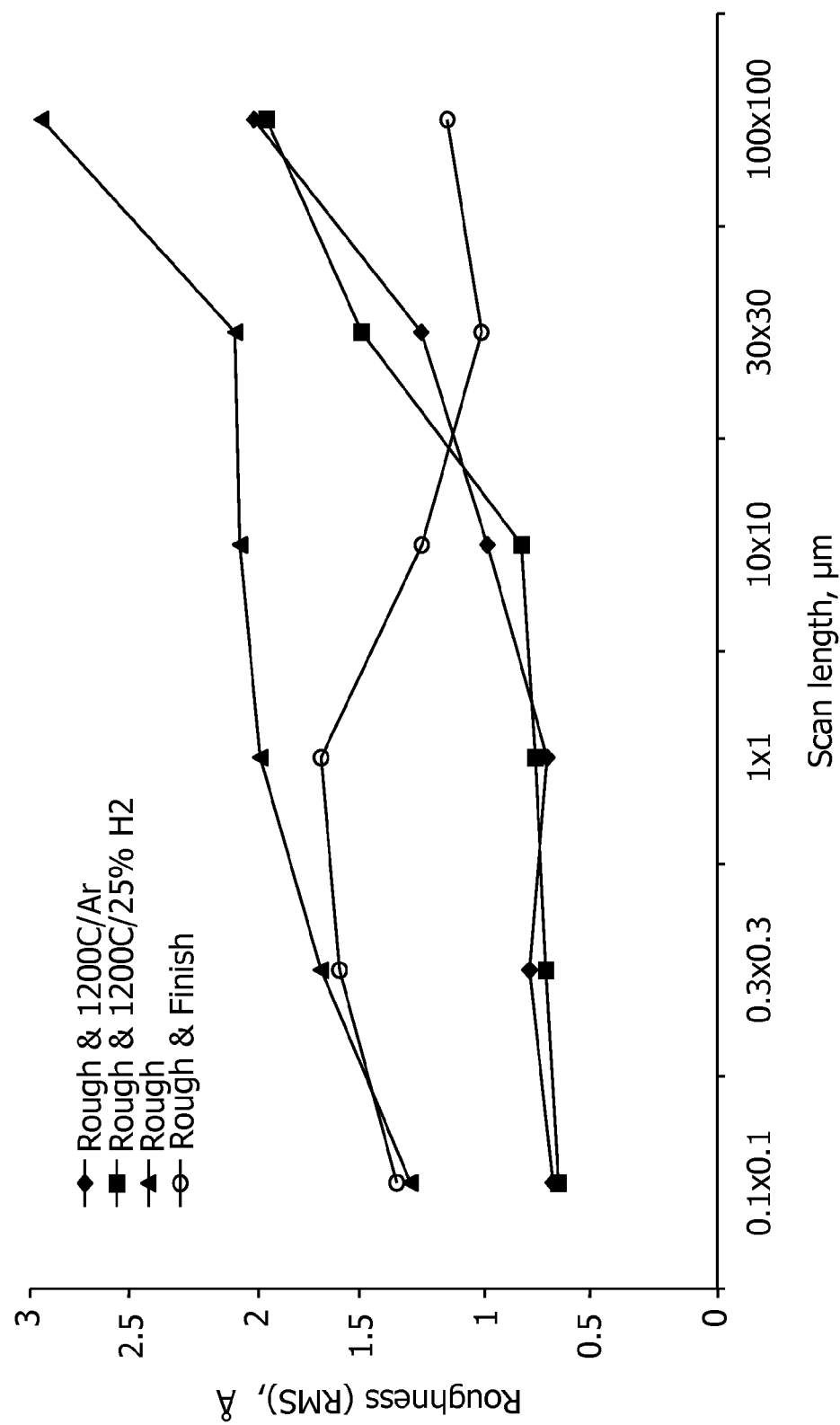
FIG. 2 is a graphical depiction of the average surface roughness (RMS) of several sets of wafers treated according to the process of Example 2 as measured with six different scan lengths.

As shown by the line labeled "Rough & Anneal" in FIG. 1 and by the lines labeled "Rough & 1200 C/Ar" and "Rough & 1200 C/25% $H_2$" in FIG. 2, the thermal anneal allows roughness as measured with scan sizes of about 1 μm×about 1 μm to about 30 μm×about 30 μm to be reduced to less than about 1.9 Å. In other embodiments the surface roughness at the same wavelengths is reduced to less than about 1.5 Å, to between about 0.6 Å and about 1.9 Å, to between about 0.6 Å and about 1.5 Å, to between about 0.7 Å and about 1.5 Å, and in yet another embodiments to about 0.9 Å.

Typically the thermal anneal is performed after the wafer has been polished. If a thermally annealed wafer is polished, the polishing step may remove the layer of atoms restructured by the thermal anneal and result in an increase in surface roughness at some wavelengths as dependent upon the polishing conditions.

According to one embodiment of the present invention, a wafer is rough polished and thermally annealed in an atmosphere comprising an inert gas, hydrogen or a mixture thereof to a temperature of from about 1050° C. to about 1350° C. According to another embodiment, a wafer is rough polished and thermally annealed in an atmosphere comprising an inert gas, hydrogen or a mixture thereof to a temperature of from about 1150° C. to about 1250° C. and, in one embodiment, from about 1200° C. to about 1250° C.

As used herein, an "inert gas" is a gas that is non-reactive with respect to silicon. Suitable inert gases include, but are not limited to, the noble gases. For purposes of the present specification, hydrogen is not considered an inert gas as it may cause slight etching on the surface of the wafer. However, hydrogen is a suitable atmosphere for the annealing processes of embodiments of the present invention. The atmosphere may include mixtures of hydrogen and inert gases or mixtures of only inert gases according to any percentage by volume of hydrogen and/or inert gases. For example, the annealing atmosphere may include 25% by volume argon and 75% by volume hydrogen.

Typically, but without limitation, the wafer is annealed in an atmosphere comprising argon to minimize operating cost, however the wafer may be annealed in other atmospheres without departing from the scope of this embodiment. In order to reduce the surface roughness of the wafer to below about 1.9 Å as measured with scan sizes of about 1 μm×about 1 μm to about 30 μm×about 30 μm, the wafer is maintained at a temperature of at least about 1050° C. for a period of at least about 5 minutes. In other embodiments the wafer is maintained at a temperature of at least 1050° C. for a period of at least about 10 minutes.

The temperature of the wafer may be maintained in an atmosphere comprising an inert gas, hydrogen or a mixture thereof at a temperature of 1150° C. for a period of at least 10 minutes to reduce the surface roughness of the wafer and to create a substantially void-free region at least about 10 μm in thickness at the surface of the wafer. According to another embodiment, the temperature of the wafer is maintained at a temperature of 1200° C. for a period of at least about 10 minutes to create a substantially void-free region at least about 10 μm in thickness at the surface of the wafer. According to another embodiment, the temperature of the wafer is maintained at a temperature of 1200° C. for a period of at least about 1 hour to create a substantially void-free region at least about 10 μm in thickness at the surface of the wafer. "Inert gases" suitable for use in the process for creating the void-free region include the gases described above, i.e., gases that are non-reactive with respect to silicon including, for example, the noble gases.

The thermal anneal reduces localized light scatterers (LLS) at the wafer surface caused by scratches, roughness and surface defects and greater than about 45 nm in diameter to no more than about 25 per wafer. Localized light scatterers may be caused by particles on the wafer, by crystal defects, by surface roughness and by scratches. Crystal defects include pits and oxygen precipitates. Some embodiments of the present invention reduce localized light scatterers at the wafer surface caused by scratches, roughness and surface defects. Specifically, by heating the wafer to a temperature above about 1050° C. for at least about 5 minutes, localized light scatterers at the wafer surface caused by scratches, roughness and surface defects and greater than about 45 nm are reduced to no more than about 25 per wafer. LLS caused by particles are not significantly reduced.

Polishing of wafers according to embodiments of the present invention may be achieved using any polishing method known to those skilled in the art for reducing roughness and, for example, may be achieved by chemical-mechanical planarization (CMP). CMP typically involves the immersion of the wafer in an abrasive slurry and polishing of the wafer by a polymeric pad. Through a combination of chemical and mechanical means the surface of the wafer is smoothed. Typically the polish is performed until a chemical and thermal steady state is achieved and until the wafers have achieved their targeted shape and flatness. The rough polish may be performed on a double-side polisher commercially available from Peter Wolters (e.g., AC2000 polisher; Rendsburg, Germany), Fujikoshi (Tokyo, Japan) or Speedfam (Kanagawa, Japan). Stock removal pads for silicon polishing are available form Psiloquest (Orlando, Fla.) or Rohm & Hass (Philadelphia, Pa.) and silica based slurries may be purchased from Rohm & Hass, Cabot (Boston, Mass.), Nalco (Naperville, Ill.), Bayer MaterialScience (Leverkusen, Germany) or DA NanoMaterials (Tempe, Ariz.).

The high temperature annealing process to which embodiments of the present invention particularly relate may be performed according to any method for annealing known to those skilled in the art and with any equipment for heating known to those skilled in the art including, for example, box furnaces, tube furnaces, vertical furnaces and horizontal furnaces.

According to one embodiment of the present invention, the high temperature annealing process is carried out in a vertical furnace. The wafers may be supported on a vertical wafer boat as they pass through the furnace. Suitable wafer boats include those described in U.S. Pat. No. 7,033,168, the contents of which are incorporated herein by reference, and may be made of high purity quartz or silicon carbide material. In applications where the wafer boat is made of quartz, the high temperature anneal is typically carried out at a temperature below about 1175° C. as temperatures above about 1175° C. may cause deformation of wafer boats made of quartz.

Methods of the present invention may be applied to one surface of the wafer or, alternatively, to the front and back surfaces of the wafer. For example, the rough polish described above may be applied to both surfaces of the wafer through a double-side polish (DSP). When a wafer is double-side polished and thermally annealed, the wafer has similar surface roughness characteristics for both the front and back surfaces of the wafer. For example, a thermal anneal of a double-side polished wafer may result in reduction of surface roughness of the front and back of the wafer to below about 1.9 Å as measured with scan sizes of about 1 µm×about 1 µm to about 30 µm×about 30 µm.

EXAMPLES

Example 1

Surface Roughness Comparison of Rough Polished; Rough Polished and Thermally Annealed; Rough Polished and Finish Polished; and Rough Polished, Finished Polished and Thermally Annealed Wafers Forty-five wafers sliced from a single crystal ingot prepared from the Czochralski method were double-side polished (Peter Wolters A C 2000P2; Rendsburg, Germany) and divided into sub-groups. Twenty-two of the double-side polished wafers were annealed in argon at 1200° C. for one hour (ASM Model A412; Bilthoven, The Netherlands). Twenty-three of the double-side polished wafers were finish polished (Lapmaster LGP-708XJ; Mt. Prospect, Ill.). All twenty-three of the wafers that were finish polished were annealed in argon at 1200° C. for one hour (ASM Model A412; Bilthoven, The Netherlands).

An AFM (Veeco NANOSCOPE III; Woodbury, N.Y.) was used to analyze surface roughness of the wafers after various stages of treatment. Analyzed wafers include wafers that were only rough polished ("Rough"), only rough and finish polished ("Rough & Finish"), rough and finish polished and annealed ("Rough & Finish & Anneal") and only rough and annealed ("Rough & Annealed"). The AFM was operated in Tapping mode with a silicon tip (APPLIED NANOSTRUCTURES). Images of the center of the wafer were captured in six fields of view (0.1 µm×0.1 µm, 0.3 µm×0.3 µm, 1 µm×1 µm, 10 µm×10 µm, 30 µm×30 µm and 100 µm×100 µm). A line resolution of 256 pixels and a scan rate of 1.0 Hz (0.5 Hz for 100 µm×100 µm scan) per line was used. Each image was flattened and the roughness measured at standard temperature and pressure.

Example 2

Surface Roughness Comparison of Rough Polished, Rough Polished and Thermally Annealed, and Rough and Finish Polished Wafers Wafers sliced from a single crystal ingot prepared from the Czochralski method were double-side polished (Peter Wolters AC2000 polisher; Rendsburg, Germany) and divided into sub-groups. Two of the wafers were annealed in a 75% argon, 25% hydrogen by volume atmosphere at 1200° C. for one hour (ASM Model A412; Bilthoven, The Netherlands) and two were annealed in a 100% argon atmosphere at 1200° C. for one hour (ASM Model A412; Bilthoven, The Netherlands). One of the wafers was not thermally annealed. With reference to FIG. 2, surface roughness (RMS) of each wafer was measured at two locations with six different scan sizes and averaged for each of the subgroups (rough polished and thermally annealed in an argon atmosphere ("Rough & 1200 C/Ar"), rough polished and thermally annealed in a 75% argon, 25% hydrogen atmosphere ("Rough & 1200 C/25% $H_2$"), rough polished and not thermally annealed ("Rough")). FIG. 2 also includes previously generated surface roughness data from wafers that were rough polished and finish polished but not thermally annealed ("Finish").

As can be seen from FIG. 1 and FIG. 2, rough polishing wafers generally does not reduce longer wavelength surface roughness as compared to finish polishing wafers. Thermally annealing rough polished wafers greatly decreases the surface roughness at this longer wavelength roughness, thereby smoothing the wafers at these wavelengths.

As can be seen from FIG. 2, the choice of annealing atmosphere does not appreciably affect the surface roughness of the rough polished and annealed wafers.

Example 3

Surface Roughness Comparison of Rough Polished and Thermally Annealed Wafers with and without Finish Polishing A wafer sliced from a single crystal ingot prepared from the Czochralski method was double-side polished (Peter Wolters AC2000 polisher; Rendsburg, Germany). A second wafer sliced from a single crystal ingot prepared from the Czochralski method was double-side polished and finish polished (Lapmaster; Mt. Prospect, Ill.). More than 0.1 µm material was removed from the surface layer during the finish polish.

Both wafers were annealed in a vertical furnace (ASM Model A412; Bilthoven, The Netherlands). The cycle time of the annealing process was 9 hours with the temperature maintained at 1200° C. for about 1 hour. The wafers were annealed in a 100% argon atmosphere.

Both wafers had surface orientation between 0.10 degrees and 1.0 degrees off the <110> direction. This orientation is preferable for annealing so that the wafers can be inspected for particles after cleaning. However, any surface orientation may be used.

An AFM (Veeco NANOSCOPE III; Woodbury, N.Y.) was used to analyze surface roughness. The AFM was operated in TAPPINGMODE with a POINTPROBE silicon tip. Images of the center of the wafer were captured in three fields of view (0.1 μm×0.1 μm, 10 μm×10 μm and 100 μm×100 μm). A line resolution of 256 pixels and a scan rate of 1.0 Hz (0.5 Hz for 100 μm×100 μm scan) per line was used. Each image was flattened and the roughness measured at standard temperature and pressure.

Figure 3:
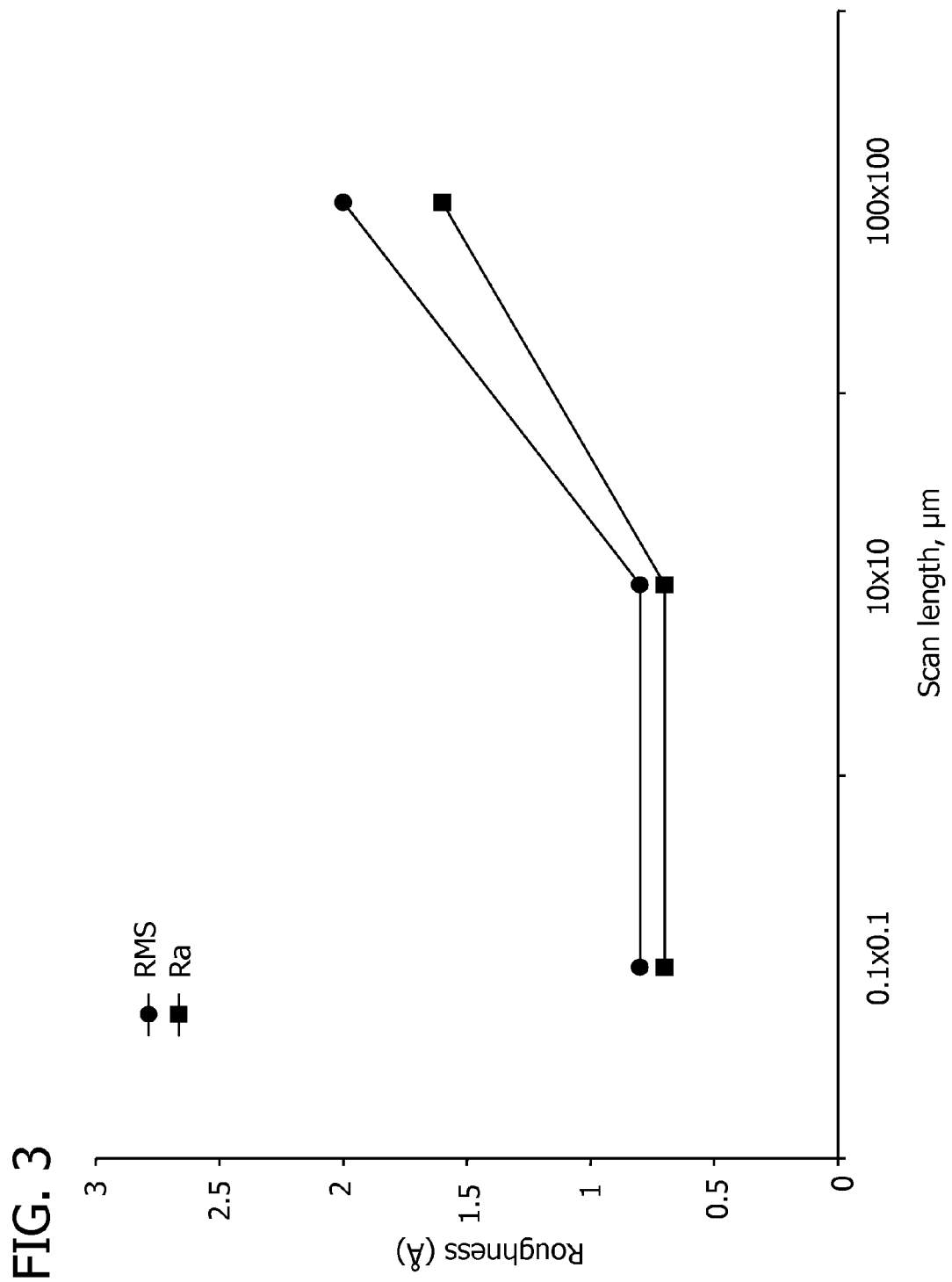
FIG. 3 is a graphical depiction of the average surface roughness (RMS and Ra) as measured with three different scan sizes of a rough polished, finish polished and thermally annealed wafer.
Figure 4:
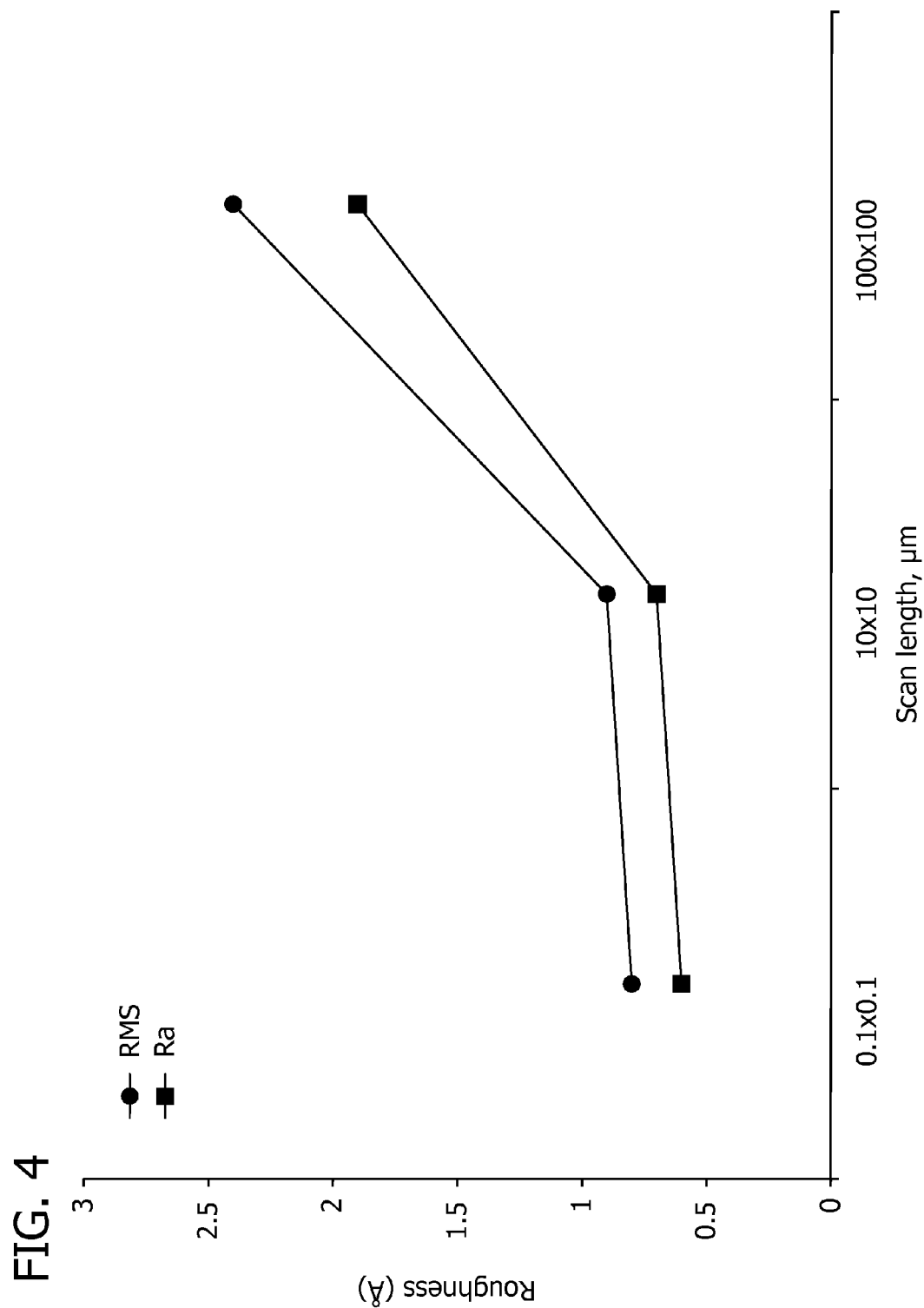
FIG. 4 is a graphical depiction of the average surface roughness (RMS and Ra) as measured with three different scan sizes of a rough polished and thermally annealed wafer.

FIG. 3 depicts the average surface roughness (RMS and Ra) as measured with the three different scan sizes of the rough polished, finish polished and thermally annealed wafer. FIG. 4 depicts the average surface roughness (RMS and Ra) as measured with the three different scan sizes of the rough polished and thermally annealed wafer. As can be seen by comparing FIG. 3 to FIG. 4, wafers which were rough polished and thermally annealed but not finish polished possessed similar surface roughness at each scan size as compared to wafers rough polished, finish polished and thermally annealed.

Example 4

LLS and Nanotopology Comparison of Rough Polished and Thermally Annealed Wafers with and without Finish Polishing Several sets of wafers were rough polished (Peter Wolters AC2000P2 polisher; Rendsburg, Germany) and several sets were rough polished and finish polished (Lapmaster LGP-708XJ; Mt. Prospect, Ill.).

All wafers were thermally annealed (ASM Model A412; Bilthoven, The Netherlands). The cycle time of the annealing process was 9 hours with the temperature maintained at 1200° C. for about 1 hour. The wafers were annealed in a 100% argon atmosphere.

Surface defects were detected as light point defects (lpds) on a surface inspection station (Tencor 6220 or Tencor SP-1; San Jose, Calif.). Nanotopology was measured with a white light, phase shift interferometer (ADE Nanomapper; Westwood, Mass.).

Table 1 below shows the performance of rough polished, thermally annealed wafers with and without finish polishing in reducing localized light scatterers.

TABLE 1

Comparison of LLS Performance between Rough Polished and Thermally Annealed Wafers with and without Finish Polishing

| LLS > 65 nm per wafer | Rough Polished, Finish Polished and Thermally Annealed Wafers | Rough Polished and Thermally Annealed Wafers |
| --- | --- | --- |
| Average Number of LLS | 42.4 | 38.9 |
| Standard Deviation | 107.7 | 13.3 |
| Number of Wafers Tested | 903 | 10 |

As can be seen from Table 1, rough polished and thermally annealed wafers contained a similar number of LLS at the surface of the wafer as compared to rough polished, finish polished and thermally annealed wafers.

Table 2 below shows the nanotopology performance of rough polished, thermally annealed wafers with and without finish polishing.

TABLE 2

Comparison of Nanotopology between Rough Polished and Thermally Annealed Wafers with and without Finish Polishing

| THA (nm) | Rough Polished, Finish Polished and Thermally Annealed Wafers | Rough Polished and Thermally Annealed Wafers |
| --- | --- | --- |
| Average Nanotopology | 23.9 | 22.8 |
| Standard Deviation | 3.41 | 0.77 |
| Number of Wafers Tested | 12 | 6 |

As can be seen from Table 2, rough polished, thermally annealed wafers had superior nanotopology performance as compared to rough polished, finish polished and thermally annealed wafers.

When introducing elements of the present invention or the preferred embodiments(s) thereof, the articles "a", "an", "the" and "said" are intended to mean that there are one or more of the elements. The terms "comprising", "including" and "having" are intended to be inclusive and mean that there may be additional elements other than the listed elements.

In view of the above, it will be seen that the several objects of the invention are achieved and other advantageous results attained.

As various changes could be made in the above methods without departing from the scope of the invention, it is intended that all matter contained in the above description and shown in the accompanying figures shall be interpreted as illustrative and not in a limiting sense.

What is claimed is:

1. A method for reducing the surface roughness of a semiconductor wafer having a front surface and a back surface, the method comprising:
   rough polishing the front surface and back surface of the wafer, wherein the polishing step does not reduce the roughness of the front surface and back surface of the wafer to below about 1.5 Å as measured with scan sizes of about 1 μm × about 1 μm to about 100μm × about 100μm; and
   thermally annealing the rough polished wafer at a temperature of at least about 1050° C. for a period of at least about 5 minutes in an atmosphere comprising an inert gas, hydrogen or a mixture thereof, wherein the wafer is not finish polished after the rough polishing step.

2. The method of claim 1 wherein the wafer is thermally annealed at a temperature of no more than about 1350° C.

3. The method of claim 2 wherein the wafer is thermally annealed at a temperature of at least about 1150° C. for a period of at least about 10 minutes to create a substantially void-free region at least about 10 μm in thickness at the front surface of the wafer.

4. The method of claim 2 wherein the wafer is thermally annealed at a temperature of at least about 1200° C. for a period of at least about 1 hour to create a substantially void-free region at least about 10 μm in thickness at the front surface of the wafer.

5. The method of claim 1 wherein the thermal anneal reduces localized light scatterers on the front surface of the wafer caused by scratches, roughness and surface defects and greater than about 45 nm in diameter to no more than about 25.

6. The method of claim 1 wherein the wafer is thermally annealed at a temperature of at least about 1050° C. for a period of at least about 10 minutes.

7. The method of claim 1 wherein the thermal anneal reduces the roughness of the front surface of the wafer to below about 1.9 Å as measured with scan sizes of about 1 μm × about 1 μm to about 30 μm × about 30 μm.

8. The method of claim 1 wherein the thermal anneal reduces the roughness of the front surface of the wafer to below about 1.5 Å as measured with scan sizes of about 1 μm × about 1μm to about 30 μm × about 30 μm.

9. The method of claim 1 wherein the thermal anneal reduces the roughness of the front surface of the wafer to between about 0.6 Å and about 1.9 Å as measured with scan sizes of about 1 μm × about 1 μm to about 30 μm × about 30 μm.

10. The method of claim 1 wherein the thermal anneal reduces the roughness of the front surface of the wafer to between about 0.6 Å and about 1.5 Å as measured with scan sizes of about 1 μm × about 1 μm to about 30 μm × about 30 μm.

11. The method of claim 1 wherein the thermal anneal reduces the roughness of the front surface of the wafer to between about 0.7 Å and about 1.5 Å as measured with scan sizes of about 1 μm × about 1 μm to about 30 μm × about 30 μm.

12. The method of claim 1 wherein the thermal anneal reduces the roughness of the front surface of the wafer to about 0.9 Å as measured with scan sizes of about 1 μm × about 1 μm to about 30 μm × about 30 μm.

13. The method of claim 1 wherein the rough polishing step does not reduce the roughness of the front surface of the wafer to below about 1.9 Å as measured with scan sizes of about 1 μm × about 1 μm to about 100 μm × about 100 μm.

14. The method of claim 1 wherein the rough polishing step removes a surface thickness on the front surface of the wafer of between about 1 μm and about 20 μm.

15. The method of claim 1 wherein the thermal anneal reduces the roughness of the back surface of the wafer to below about 1.9 Å as measured with scan sizes of about 1 μm × about 1 μm to about 30 μm × about 30 μm.

16. The method as set forth in claim 1 wherein the atmosphere in which the polished wafer is thermally annealed comprises an inert gas.

17. The method as set forth in claim 16 wherein the inert gas is argon.

18. The method as set forth in claim 1 wherein the atmosphere in which the polished wafer is thermally annealed consists essentially of an inert gas.

19. The method as set forth in claim 18 wherein the inert gas is argon.

20. The method as set forth in claim 1 wherein the thermal anneal reduces the roughness of the front surface of the wafer to below about 2.5 Å as measured with a scan size of about 100 μm × about 100 μm.

21. A method for reducing the surface roughness of a semiconductor wafer having a front surface and a back surface, the method comprising:
rough polishing the front surface and back surface of the wafer, wherein the polishing step does not reduce the roughness of the front surface and back surface of the wafer to below about 1.3 Å as measured with a scan size of about 10 μm × about 10 μm;
thermally annealing the rough polished wafer at a temperature of at least about 1050° C. for a period of at least about 5 minutes in an atmosphere comprising an inert gas, hydrogen or a mixture thereof, wherein the wafer is not finish polished after the rough polishing step.

22. The method as set forth in claim 21 wherein the atmosphere in which the polished wafer is thermally annealed comprises an inert gas.

23. The method as set forth in claim 22 wherein the inert gas is argon.

24. The method as set forth in claim 21 wherein the atmosphere in which the polished wafer is thermally annealed consists essentially of an inert gas.

25. The method as set forth in claim 24 wherein the inert gas is argon.

26. The method as set forth in claim 21 wherein the thermal anneal reduces the roughness of the front surface of the wafer to below about 2.5 Å as measured with a scan size of about 100 μm × about 100 μm.

27. A method for reducing the surface roughness of a semiconductor wafer having a front surface and a back surface, the method comprising:
rough polishing the front surface and back surface of the wafer, wherein the polishing step does not reduce the roughness of the front surface and back surface of the wafer to below about 1.5 Å as measured with scan sizes of about 1 μm × about 1 μm to about 100 μm × about 100 μm; and
thermally annealing the polished wafer, wherein the thermal anneal reduces the surface roughness of the front surface and back surface of the wafer to below about 1.5 Å as measured with scan sizes of about 1 μm × about 1 μm to about 30 μm × about 30μm, wherein the wafer is not finish polished after the rough polishing step.

28. The method of claim 27 wherein the thermal anneal reduces the roughness of the front surface of the wafer to between about 0.6 Å and about 1.5 Å as measured with scan sizes of about 1 μm × about 1 μm to about 30 μm × about 30 μm.

29. The method of claim 26 wherein the wafer is thermally annealed at a temperature of from about 1050° C. to about 1350° C. in an atmosphere comprising an inert gas, hydrogen or a mixture thereof.

30. The method of claim 28 wherein the wafer is thermally annealed at a temperature of at least about 1050° C. for a period of at least about 5 minutes.

31. The method of claim 28 wherein the wafer is thermally annealed at a temperature of at least about 1050° C. for a period of at least about 10 minutes.

32. The method of claim 28 wherein the wafer is thermally annealed at a temperature of at least about 1150° C. for a period of at least about 10 minutes so as to create a substantially void-free region at least about 10 μm in thickness at the front surface of the wafer.

33. The method of claim 28 wherein the wafer is thermally annealed at a temperature of at least about 1200° C. for a period of at least about 1 hour so as to create a substantially void-free region at least about 10 μm in thickness at the front surface of the wafer.

34. The method of claim 28 wherein the rough polishing step does not reduce the roughness of the front surface of the wafer to below about 1.9 Å as measured with scan sizes of about 1 μm × about 1 μm to about 100 μm × about 100 μm.

35. The method of claim 28 wherein the rough polishing step removes a surface thickness on the front surface of the wafer of between about 1 μm and about 20 μm.

36. The method of claim 28 wherein the thermal anneal reduces the roughness of the back surface of the wafer to below about 1.9 Å as measured with scan sizes of about 1 μm × about 1 μm to about 30 μm × about 30 μm.

37. The method of claim 28 wherein the thermal anneal reduces localized light scatterers on the front surface of the wafer caused by scratches, roughness and surface defects and greater than about 45 nm in diameter to less than about 25.

38. The method of claim 27 wherein the wafer is thermally annealed at a temperature of from about 1050° C. to about 1350° C. in an atmosphere comprising an inert gas, hydrogen or a mixture thereof.

39. The method of claim 27 wherein the thermal anneal reduces the roughness of the front surface of the wafer to between about 0.7 Å and about 1.5 Å as measured with scan sizes of about 1 μm × about 1 μm to about 30 μm × about 30 μm.

40. The method of claim 27 wherein the thermal anneal reduces the roughness of the front surface of the wafer to about 0.9 Å as measured with scan sizes of about 1 μm × about 1 μm to about 30 μm × about 30 μm.

41. The method as set forth in claim 22 wherein the atmosphere in which the polished wafer is thermally annealed comprises an inert gas.

42. The method as set forth in claim 41 wherein the inert gas is argon.

43. The method as set forth in claim 29 wherein the atmosphere in which the polished wafer is thermally annealed consists essentially of an inert gas.

44. The method as set forth in claim 43 wherein the inert gas is argon.

45. The method as set forth in claim 27 wherein the thermal anneal reduces the roughness of the front surface of the wafer to below about 2.5 Å as measured with a scan size of about 100 μm × about 100 μm.

46. A method for reducing the surface roughness of a semiconductor wafer having a front surface and a back surface, wherein the resulting wafer contains a substantially void-free region at least about i0~m in thickness at the front surface of the wafer, the method comprising:

rough polishing the front surface and back surface of the wafer, wherein the polishing step does not reduce the roughness of the front surface and back surface of the wafer to below about 1.5 Å as measured with scan sizes of about 1 μm × about 1 μm to about 100 μm × about 100 μm; and thermally annealing the rough polished wafer at a temperature of at least about 1150° C. for a period of at least about 10 minutes in an atmosphere comprising an inert gas, hydrogen or a mixture thereof, wherein the wafer is not finish polished after the rough polishing step.

47. The method of claim 46 wherein the polished wafer is thermally annealed at a temperature of at least about 1200° C. for a period of at least about 1 hour in an atmosphere comprising an inert gas, hydrogen or a mixture thereof.

48. The method of claim 46 wherein the thermal anneal reduces localized light scatterers on the front surface of the wafer caused by scratches, roughness and surface defects and greater than about 45 nm in diameter to less than about 25.

49. The method as set forth in claim 46 wherein the atmosphere in which the polished wafer is thermally annealed comprises an inert gas.

50. The method as set forth in claim 49 wherein the inert gas is argon.

51. The method as set forth in claim 46 wherein the atmosphere in which the polished wafer is thermally annealed consists essentially of an inert gas.

52. The method as set forth in claim 51 wherein the inert gas is argon.

53. The method as set forth in claim 46 wherein the thermal anneal reduces the roughness of the front surface of the wafer to below about 2.5 Å as measured with a scan size of about 100 μm × about 100 μm.

* * * * *